(12) United States Patent
Weil et al.

(10) Patent No.: US 11,271,576 B1
(45) Date of Patent: Mar. 8, 2022

(54) DIGITAL-TO-ANALOG CONVERTER (DAC) WITH COMMON-MODE CORRECTION

(71) Applicant: QUALCOMM Incorporated, San Diego, CA (US)

(72) Inventors: Andrew Weil, San Diego, CA (US); Ashok Swaminathan, Cardiff, CA (US); Siyu Yang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/223,559

(22) Filed: Apr. 6, 2021

(51) Int. Cl.
*H03M 1/10* (2006.01)

(52) U.S. Cl.
CPC .................................. *H03M 1/1009* (2013.01)

(58) Field of Classification Search
CPC ....... H03M 1/1009; H03M 1/66; H03M 1/785
USPC ......................................... 341/120, 144, 154
See application file for complete search history.

(56) References Cited

U.S. PATENT DOCUMENTS

| | | | | |
|---|---|---|---|---|
| 5,448,238 A * | 9/1995 | White | .................... | H03M 1/785 341/134 |
| 5,703,586 A | 12/1997 | Tucholski | | |
| 8,493,257 B2 * | 7/2013 | Nagatani | ................ | H03M 1/662 341/144 |
| 9,503,113 B1 * | 11/2016 | Thomsen | ................. | H03M 1/66 |
| 9,515,671 B1 * | 12/2016 | Thomsen | ............. | H03M 1/0607 |
| 9,819,357 B1 * | 11/2017 | Guo | ..................... | H03M 1/0607 |
| 10,454,487 B1 * | 10/2019 | Sedighi | ................. | H03M 1/742 |
| 2008/0036634 A1 | 2/2008 | Marais | | |
| 2011/0273317 A1 * | 11/2011 | Nagatani | ................ | H03M 1/662 341/144 |
| 2013/0314263 A1 * | 11/2013 | Dix | ......................... | H03M 1/06 341/154 |
| 2015/0097712 A1 * | 4/2015 | Downey | ................ | H03M 1/785 341/144 |
| 2019/0140656 A1 * | 5/2019 | Downey | ................ | H03M 1/785 |

FOREIGN PATENT DOCUMENTS

WO     2018208428 A1     11/2018

* cited by examiner

*Primary Examiner* — Jean B Jeanglaude
(74) *Attorney, Agent, or Firm* — Patterson+ Sheridan, L.L.P.

(57) ABSTRACT

Certain aspects of the present disclosure provide a digital-to-analog converter (DAC). The DAC generally includes a plurality of current-steering cells, each having a bypass switch, and a resistor ladder circuit having multiple segments. Each segment may include a first resistive element and a second resistive element, the bypass switch being configured to selectively provide a bypass current to a common node between the first resistive element and the second resistive element.

28 Claims, 6 Drawing Sheets

DIGITAL-TO-ANALOG CONVERTER (DAC) WITH COMMON-MODE CORRECTION

BACKGROUND

Field of the Disclosure

Certain aspects of the present disclosure generally relate to electronic components and, more particularly, to circuitry for digital-to-analog conversion.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system).

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a digital-to-analog converter (DAC). The DAC generally includes: a plurality of current-steering cells, each having a bypass switch; and a resistor ladder circuit having multiple segments, each segment having a first resistive element and a second resistive element, the bypass switch being configured to selectively provide a bypass current to a common node between the first resistive element and the second resistive element.

Certain aspects of the present disclosure provide a method for digital-to-analog conversion. The method generally includes: receiving a digital input code; and generating an analog output signal based on the digital input code by selectively providing, via at least one of a bypass switch of each of a plurality of current-steering cells, a bypass current to a common node of at least one of multiple segments of a resistor ladder circuit, each of the multiple segments having a first resistive element and a second resistive element, the common node being between the first resistive element and the second resistive element of the at least one of the multiple segments.

Certain aspects of the present disclosure provide a digital-to-analog conversion system. The digital-to-analog conversion system generally includes a DAC, and a calibration DAC configured to generate an analog output signal and calibrate the DAC via the analog output signal. The calibration DAC may include: a plurality of current-steering cells, each having a bypass switch; and a resistor ladder circuit having multiple segments, each segment having a first resistive element and a second resistive element, the bypass switch being configured to selectively provide a bypass current to a common node between the first resistive element and the second resistive element to generate the analog output signal.

Certain aspects of the present disclosure provide a digital-to-analog conversion system. The digital-to-analog conversion system generally includes a DAC having a first output, and a calibration DAC having a second output coupled to the first output. The calibration DAC may include: a plurality of current-steering cells, at least one of which includes a first switch, a second switch, and a third switch coupled in parallel; and a resistor ladder circuit having multiple segments, at least one of the segments having a first resistive element coupled between a first node and a common node, and a second resistive element coupled between the common node and a second node. The first switch may be coupled to the first node, the second switch may be coupled to the second node, and the third switch may be coupled to the common node.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for digital-to-analog conversion. For example, certain aspects provide a digital-to-analog converter (DAC) (e.g., an R-2R resistor ladder DAC) including current steering cells, each having a bypass switch. The bypass switch may facilitate common-mode correction by providing a common-mode current to a resistor ladder circuit of the DAC, as described in more detail herein.

Example Wireless Communications

Figure 1:
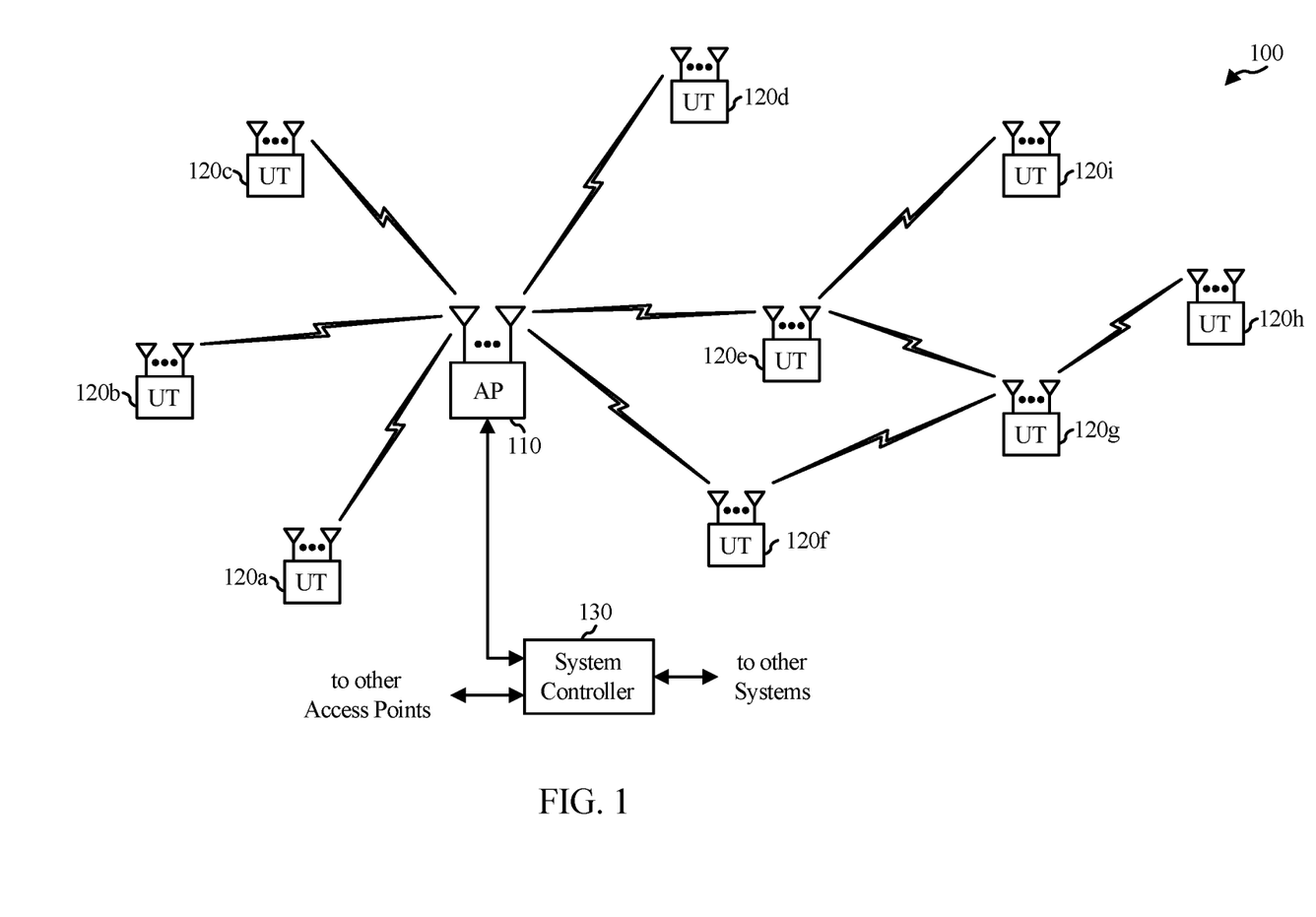
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include an R-2R digital-to-analog converter (DAC) implemented with current steering cells having bypass switches, as described in more detail herein.

Figure 2:
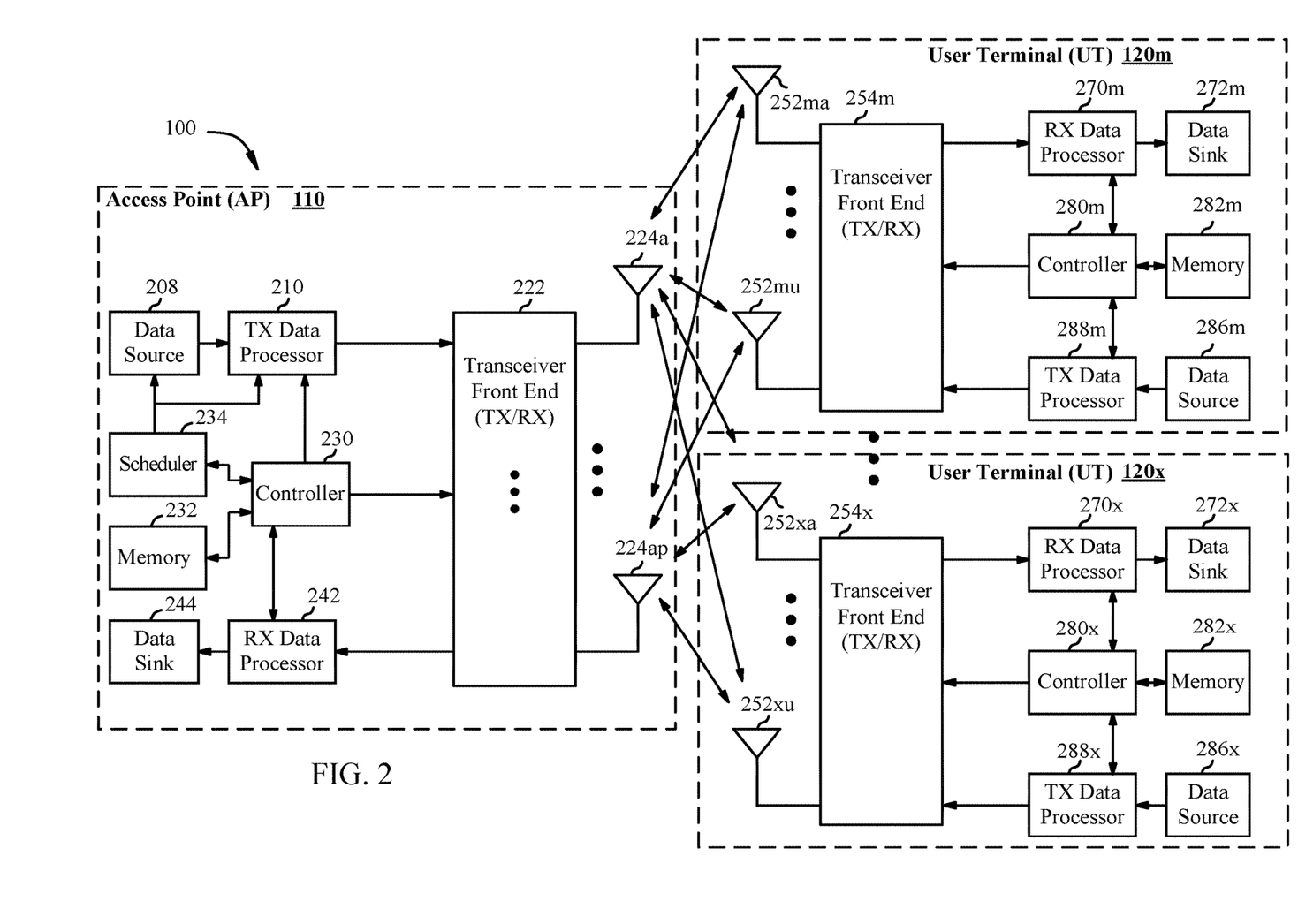
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one or more of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one or more of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one or more of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol stream for one of more of the $N_{dn}$ user terminals to be transmitted from one or more of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include an R-2R DAC implemented with current steering cells having bypass switches, as described in more detail herein.

Figure 3:
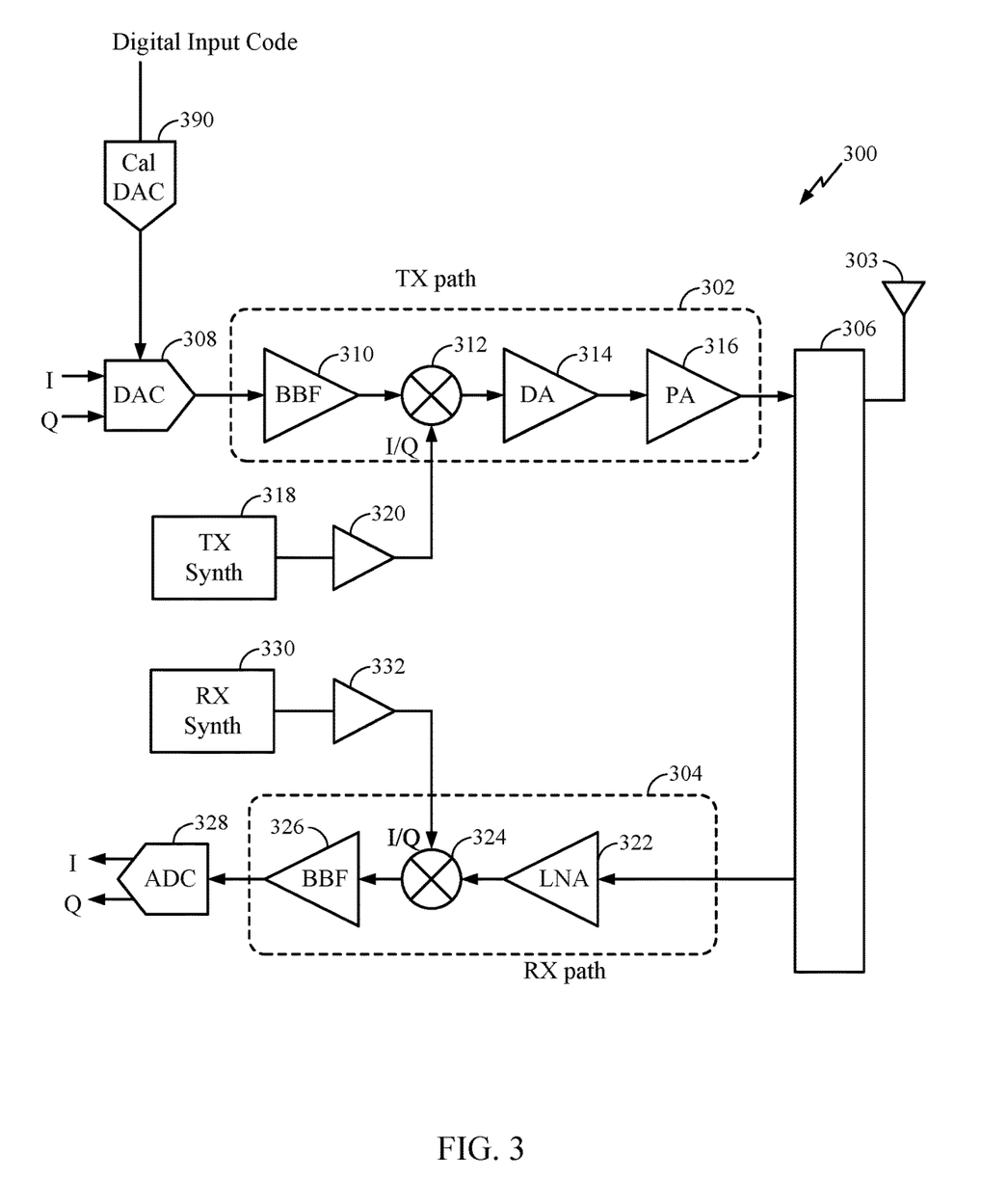
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. In some aspects, transceiver front end 300 may include a calibration DAC 390, which may be implemented as an R-2R DAC, for example. The calibration DAC 390 may have current steering cells implemented using bypass switches. The calibration DAC 390 may be used to calibrate the DAC 308 (e.g., also referred to as a "transmitter DAC"). In some aspects, an output of the calibration DAC 390 may be coupled to an output of the DAC 308, for example such that current output by the calibration DAC 390 is added to current output by the DAC 308. The BBF 310, the mixer 312, and the DA 314 may be included in a radio frequency integrated circuit (RFIC), while the PA 316 may be external to the RFIC. In some aspects, the DAC 308 and calibration DAC 390 may also be included in the RFIC. In some aspects, additional frequency conversion circuitry may be implemented with the PA 316 on a separate chip.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which may involve compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. It will be understood that while examples discussed herein utilize I and Q signals, elements of the transceiver front end 300 may be configured to utilize polar modulation.

Example Techniques for Digital-to-Analog Conversion

Digital calibration techniques may use a digital-to-analog converter (DAC) with a resistor ladder (e.g., R-2R resistor ladder) to facilitate DAC calibration. The R-2R resistor ladder generally refers to a resistor ladder network with resistive elements in a series path (for single-ended implementations) or two series paths (for differential implementations), and resistive elements in shunt paths coupled to the resistive elements in the series path(s). At least some of the resistive elements in the shunt paths may have twice the resistance of the resistive elements in the series path(s), hence the name "R-2R resistor ladder." A calibration DAC (e.g., DAC 390) may be used to compensate for current source errors associated with another DAC, such as DAC 308 of FIG. 3. Some DAC designs use current steering techniques for the R-2R resistor ladder implemented to facilitate two logic values.

Certain aspects of the present disclosure improve the static linearity of an R-2R DAC by implementing a third state, thereby using +1, 0, and −1 states. For example, each current steering cell of a DAC may be implemented with a bypass path, as described in more detail herein. Using a bypass path allows for improved calibration accuracy or relaxed current source matching as compared to conventional implementations. In other words, the bypass switch may facilitate common-mode correction of the calibration DAC, reducing digital-to-analog conversion error. Therefore, the calibration DAC may allow for a more accurate calibration of a transmitter DAC (e.g., DAC 308), and as a result, relax current source matching specifications for the transmitter DAC.

Figure 4:
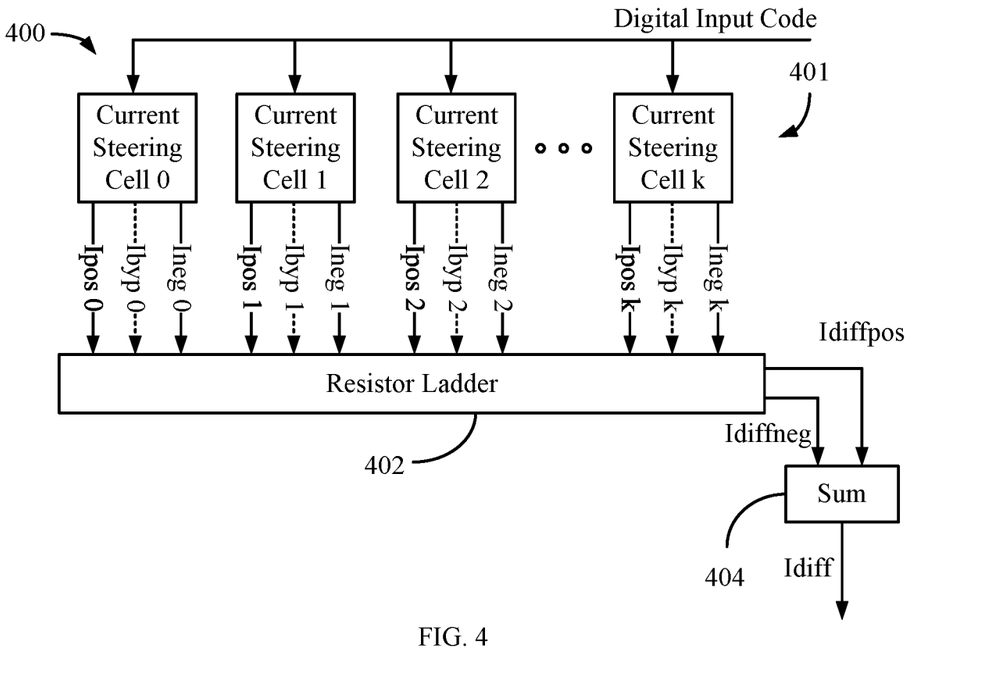
FIG. 4 illustrates an example digital-to-analog converter (DAC), in accordance with certain aspects of the present disclosure.

FIG. 4 illustrates an example DAC 400 (e.g., corresponding to calibration DAC 390 of FIG. 3), in accordance with certain aspects of the present disclosure. Depending on a digital input code, each current steering cell 401 of the DAC 400 may source a positive current (e.g., Ipos 0 to Ipos k, k being an integer greater than 1, where k+1 is the number of cells) or a negative current (e.g., Ineg 0 to Ineg k) to a resistor ladder circuit 402 depending on a logic level for a respective bit of the digital input code. A "positive current" from a current steering cell generally refers to a current sourced to a positive ladder node of a resistor ladder circuit, and a "negative current" from a current steering cell generally refers to a current sourced to a negative ladder node of the resistor ladder circuit, as described in more detail herein. Each of the current steering cells 401 may include switches to selectively provide a respective one of Ipos 0 to Ipos k or a respective one of Ineg 0 to Ineg k to the resistor ladder circuit 402.

The positive currents (Ipos 0 to Ipos k) from the current steering cells 401 contribute mostly to a positive portion (Idiffpos) of a differential output current, and the negative currents (Ineg 0 to Ineg k) from the current steering cells 401 contribute mostly to a negative portion (Idiffneg) of a differential output current of the resistor ladder circuit 402. Idiffpos and Idiffneg may be summed (e.g., via summing circuit 404, or at a summing node) to generate a differential output current (Idiff) in some aspects. In other aspects, the outputs of the resistor ladder circuit 402 are not summed, and Idiff represents a difference between the unsummed signals Idiffpos and Idiffneg. The positive or negative currents generated by each current steering cell contribute to residual differential errors at the output of the DAC 400. The residual differential error may be associated with a current source of each of the current steering cells, as described in more detail herein.

The digital input code may be based on an input to the DAC 308, and may be provided by one of the controllers 230, 280, for example, or another controller (e.g., a controller in the front end 222, 254). The DAC 400 may be configured to correct or compensate for error or inaccuracy in the output of the DAC 308, for example due to nonlinearities in the DAC 308 or other circuitry preceding the DAC 308, based on the digital input code.

Figure 5:
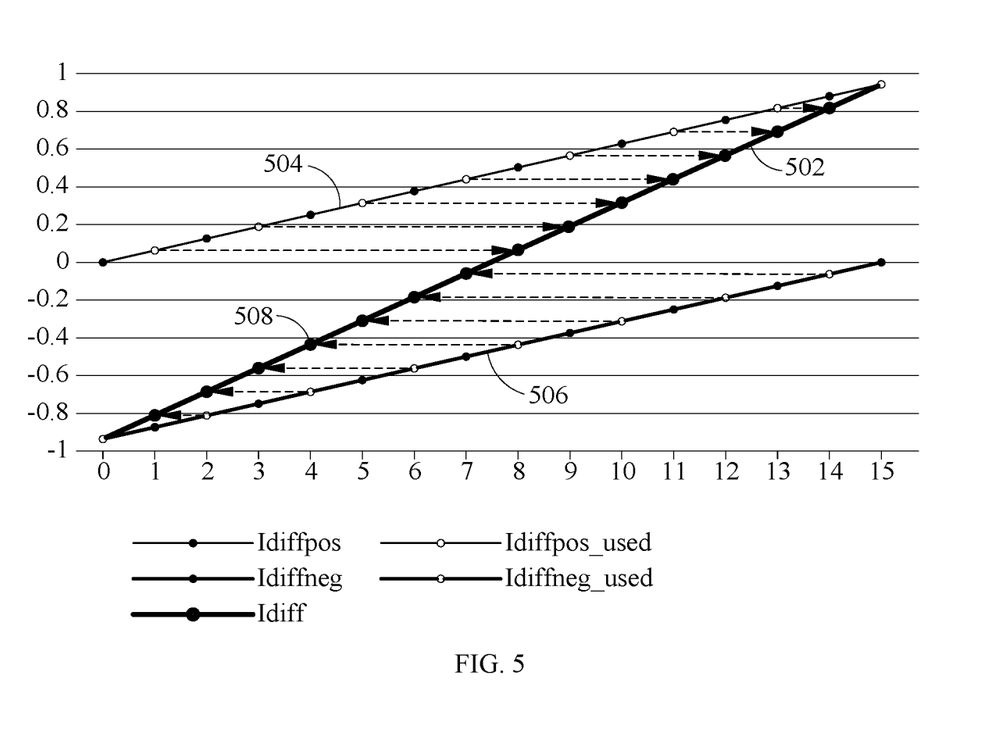
FIG. 5 is a graph illustrating an output current of a DAC, in accordance with certain aspects of the present disclosure.

FIG. 5 is a graph illustrating Idiffpos and Idiffneg for generating Idiff. For example, Idiff 502 of the DAC 400 may be generated based on the sum of Idiffpos 504 and Idiffneg 506, or may represent a difference between these two signals. For instance, Idiff associated with input digital code 4 (at point 508) may be generated by the Idiffpos and Idiffneg associated with input digital code 4, as illustrated.

In this example, all current steering cells 401 generate either a respective Ipos or Ineg such that Idiffpos 504 is generated and Idiffneg 506 is generated, and Idiff is based on both Idiffpos 504 and Idiffneg 506, as described further below.

Conventionally, Idiffpos for input digital code 4 may be generated by positive currents (e.g., Ipos 0 to Ipos 4) via current steering cells 0-4, while the remaining current steering cells 5-15 (in the illustrated example where k=15, for example for a 4 bit digital input code) supply negative currents (e.g., Ineg 5 to Ineg k). Thus, for each of the digital input codes 1-14, all the current steering cells 0-15 are supplying a current (either positive or negative) for generating Idiffpos 504 or Idiffneg 506, and may contribute to error at the output of the DAC 400.

In certain aspects of the present disclosure, these errors may be eliminated (or at least reduced) by converting some of the differential currents provided by the current steering cells to common-mode currents. For example, as illustrated in FIG. 4, each current steering cell may include a bypass signal path, allowing each of the current steering cells to provide a bypass current (Ibyp 0 to Ibyp k) that contributes equally to Idiffpos and Idiffneg. Thus, any error associated with a current steering cell that is providing a bypass current may have little to no impact on the error associated with Idiff at the output of the DAC 400.

Figure 6:
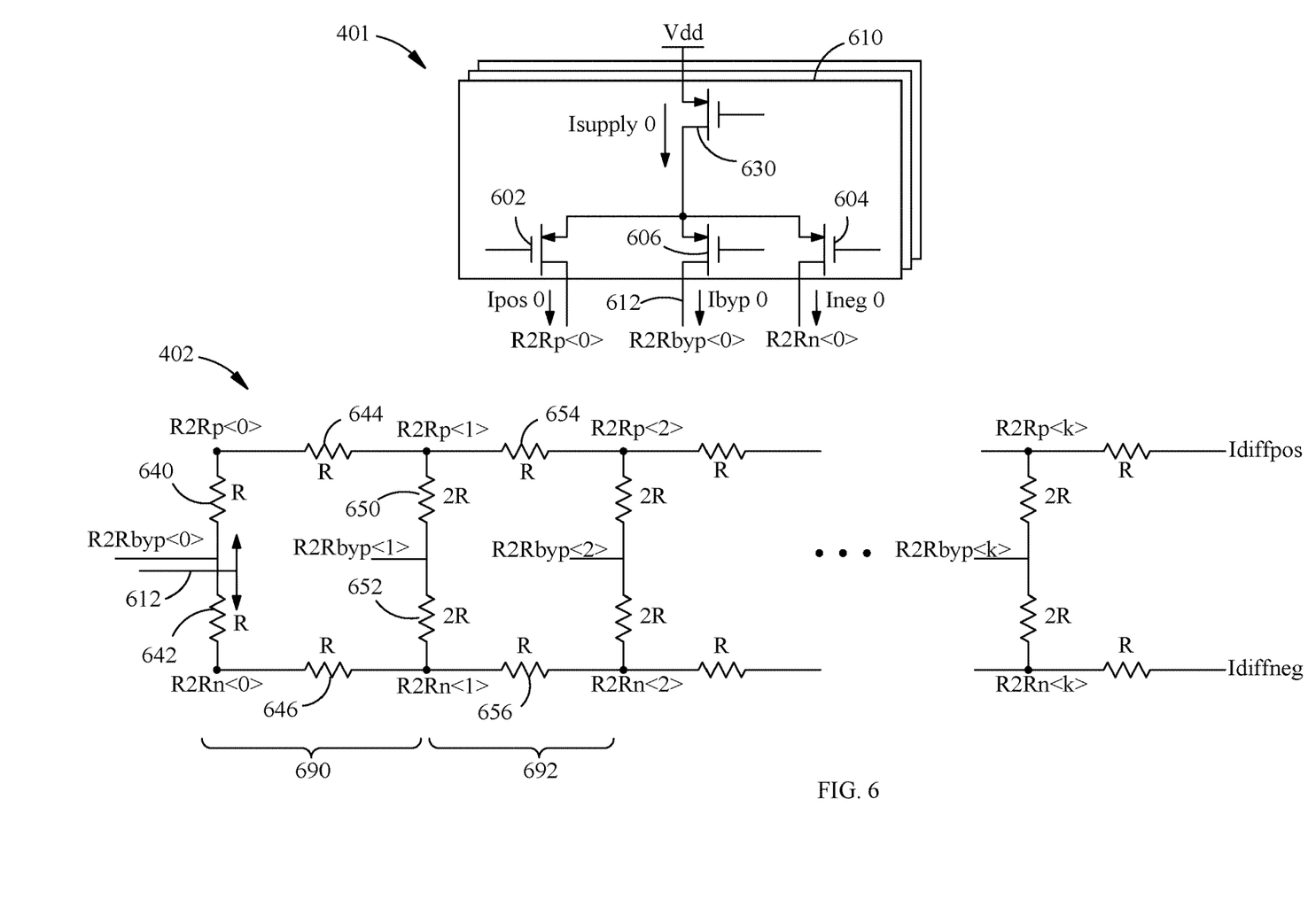
FIG. 6 illustrates current steering cells coupled to a resistor ladder circuit of a DAC, in accordance with certain aspects of the present disclosure.

FIG. 6 illustrates current steering cells 401 and the resistor ladder circuit 402, in accordance with certain aspects of the present disclosure. As illustrated, the resistor ladder circuit 402 may be implemented as an R-2R type ladder circuit. For example, the resistor ladder circuit 402 may include multiple segments (e.g., segments 690, 692), each of the segments including a positive ladder node R2Rp<0> to R2Rp<k> and a negative ladder node R2Rn<0> to R2Rn<k>. Between the positive ladder node and the negative ladder node of each segment may be resistive elements (e.g., resistive elements 640, 642, or resistive elements 650, 652). A bypass ladder node R2Rbyp<0> to R2Rbyp<k> may be coupled between the resistive elements (e.g., resistive elements 640, 642, or resistive elements 650, 652) of each segment, as illustrated. Moreover, a resistive element (e.g., resistive element 644 or 654) may be coupled between the positive nodes of adjacent segments of the resistor ladder circuit 402, and a resistive element (e.g., resistive element 646 or 656) may be coupled between the negative nodes of adjacent segments of the resistor ladder circuit 402.

Each of the current steering cells 401 includes a current source coupled to a voltage rail Vdd, a positive switch for selectively providing a positive current to a positive ladder node, and a negative switch for providing a negative current to a negative ladder node. For example, supply current Isupply 0 through the current source 630 may be directed via the positive switch 602 of the current steering cell 610 (e.g., corresponding to current steering cell 0 of FIG. 4) to provide a (positive) current (e.g., Ipos 0) to the positive ladder node R2Rp<0>. Similarly, Isupply 0 through the current source 630 may be directed via the negative switch 604 to provide a (negative) current (e.g., Ineg 0) to the negative ladder node R2Rn<0>. In a similar manner, currents from current sources of other current steering cells may be directed via positive and negative switches to respective positive and negative ladder nodes (R2Rp<1> to R2Rp<k>, and R2Rn<1> to R2Rn<k>).

The positive switch 602 may be closed to assert a logic high (+1), and the negative switch 604 may be closed to assert a logic low (−1) based on the digital input code (FIG. 4) by applying an appropriate value to the gates thereof. In certain aspects, each of the current steering cells includes a bypass switch (e.g., bypass switch 606) to allow for a third logic state (0) to be asserted based on the digital input code by applying an appropriate signal to a gate thereof, as described herein. The bypass switches of the current steering cells may supply bypass currents to bypass nodes R2Rbyp<0> to R2Rbyp<k>. For any given current steering cell, only one of the positive switch (e.g., positive switch 602), the negative switch (e.g., negative switch 604), and the bypass switch (e.g., bypass switch 606) may be closed at any given time. That is, each of the current steering cells may provide only one of Ipos (a positive current), Ibyp (a bypass current), or Ineg (a negative current) at any given time, depending on the digital input code.

The current steering cells may be mapped for each digital input code to deliver only positive (and no negative) current, or only negative (and no positive) current as opposed to a mixture of the two. For example, certain codes are associated with only Ipos (and not Ineg) being delivered. The Ipos may be delivered by one or multiple current steering cells 401, depending on the code. In this example, the remaining codes are associated with only Ineg (and not Ipos) being delivered. The Ineg may be delivered by one or multiple current steering cells 401, depending on the code. Any unused current steering cell may deliver common-mode current (e.g., via the bypass switch 606). In other words, depending on a digital input code to the DAC, only positive differential current switches (e.g., positive switches of current steering cells 0-5, in a first example) may be configured to be closed during digital-to-analog conversion, or only negative differential current switches (e.g., negative switches of current steering cells 0-7, in a second example) may be configured to be closed during the digital-to-analog conversion. The bypass switches of any unused current steering cells (e.g., current steering cells 6-k in the first example, or current steering cells 8-k in the second example) may be configured to be closed during the digital-to-analog conversion.

The switch 606 may be coupled to a bypass node (R2Rbyp<0>), and a bypass current 612 (e.g., Ibyp 0) may be sourced from the current steering cell 610. The bypass current 612 may split and flow equally towards positive and negative ladder nodes R2Rp<0> and R2Rn<0>. Therefore, any error associated with the current steering cell 610 due to the current source 630 may equally impact Idiffpos and Idiffneg at the output of the resistor ladder circuit 402 such that the error is cancelled out and does not impact the differential output current Idiff.

As described, the current steering cells may be remapped (as compared to the conventional operation described above with respect to FIG. 5) for each digital input code. For example, as illustrated in FIG. 5, for digital input codes 8-15, one or more current steering cells (e.g., mapped to input digital codes 1, 3, 5, 7, 11, 13, and 15 in conventional operation) may be configured to provide a positive differential current (labeled "Idiffpos_used") to generate Idiff. For example, for positive values of Idiff, only the currently steering cells which would have been used to provide the corresponding value on the conventional Idiffpos curve 504 are used to provide Ipos. Thus, Idiff can be conceptualized as not being generated by a combination of positive and negative currents (Idiffpos and Idiffneg) in this scenario, but only by positive current (Idiffpos). Any current steering cell that does not provide a positive differential current may be configured to provide a bypass current, as described herein. As described above, current may actually flow towards the Idiffneg output when a bypass current is coupled to the resistor ladder, but may be cancelled in the calculation or generation of Idiff by an equivalent current flowing toward Idiffpos.

On the other hand, for digital input codes 0-7, one or more current steering cells (e.g., mapped to input digital codes 0, 2, 4, 6, 8, 10, 12, and 14 in conventional operation) may be configured to provide a negative differential current (labeled "Idiffneg used") to generate Idiff. For example, for negative values of Idiff, only the currently steering cells which would have been used to provide the corresponding value on the conventional Idiffneg curve 506 are used to provide Ineg. Thus, Idiff can be conceptualized as not being generated by a combination of positive and negative currents (Idiffpos and Idiffneg) in this scenario, but only by negative current (Idiffneg). Any current steering cell that does not provide a negative differential current may be configured to provide a bypass current, as described herein. As described above, current may actually flow towards the Idiffpos output when a bypass current is coupled to the resistor ladder, but may be cancelled in the calculation or generation of Idiff by an equivalent current flowing toward Idiffneg.

Figure 7:
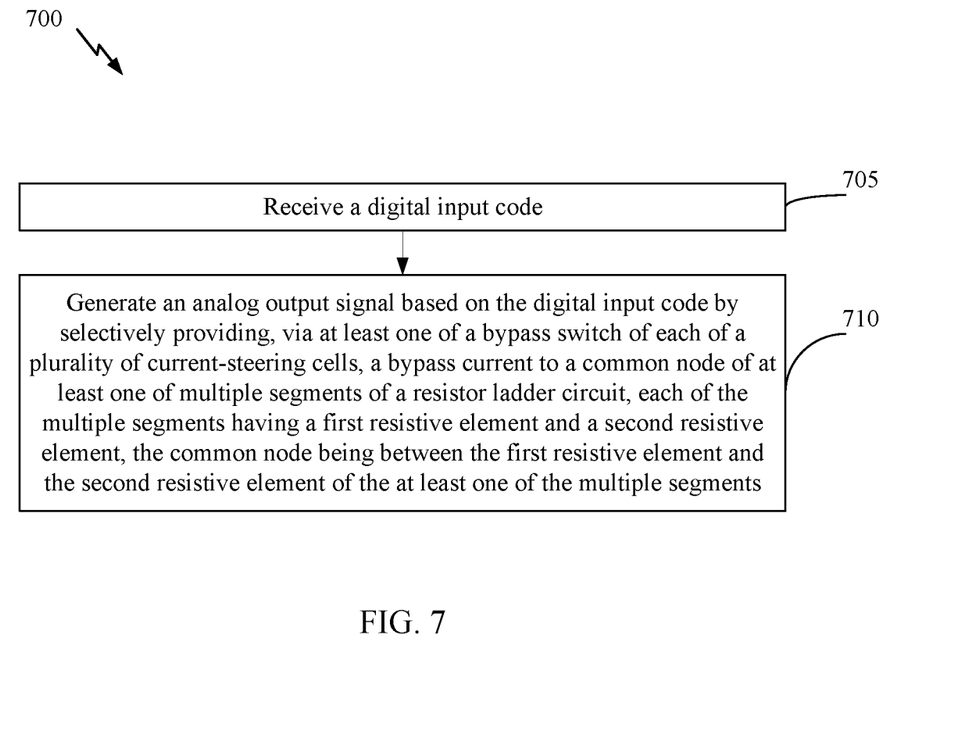
FIG. 7 is a flow diagram depicting example operations for digital-to-analog conversion, in accordance with certain aspects of the present disclosure.

FIG. 7 is a flow diagram depicting example operations 700 for digital-to-analog conversion, in accordance with certain aspects of the present disclosure. For example, the operations 700 may be performed by a DAC, such as the DAC 400.

The operations 700 begin, at block 705, with the DAC receiving a digital input code, and at block 710, generating an analog output signal (e.g., Idiff) based on the digital input code by selectively providing, via at least one of a bypass switch (e.g., bypass switch 606) of each of a plurality of current steering cells (e.g., current steering cells 401), a bypass current (e.g., Ibyp 0) to a common node (e.g., R2Rbyp<0>) of at least one of multiple segments of a resistor ladder circuit (e.g., resistor ladder circuit 402). Each of the multiple segments may have a first resistive element (e.g., resistive element 640 or 650) and a second resistive element (e.g., resistive element 642 or 652), the common node being between the first resistive element and the second resistive element of the at least one of the multiple segments.

In certain aspects, the first resistive element and the second resistive element may be coupled between a positive node (e.g., positive ladder node R2Rp<0>) and a negative node (e.g., R2Rn<0>) of each of the multiple segments. Each of the plurality of current-steering cells may include a positive differential current switch (e.g., positive switch 602) and a negative differential current switch (e.g., negative switch 604). Generating the analog output signal may include selectively providing, via at least one of the positive differential current switches, a current (e.g., Isupply 1 or Ipos 1) to the positive node of at least one of the multiple segments, or selectively providing, via at least one of the negative differential current switches, the current (e.g., Isupply 1 or Ineg 1) to the negative node of at least one of the multiple segments. The bypass switch (e.g., bypass switch 606), the positive differential current switch (e.g., positive switch 602), and the negative differential current switch (e.g., negative switch 604) may be controlled (to either open or close) by a voltage or bias, or other control signal, applied to the gates thereof, based on the digital input code received at block 705. Circuitry for applying such control may be included in the transceiver front end (transceiver front end 222, 254), for example in a non-illustrated portion of the DAC 390, or in another section of the device 110, 120. Thus, the generating may include applying one or more voltages or control signals to the gates of appropriate switches within one or more current steering cells (e.g., current steering cells 401) based on the digital input code received at block 705. In some aspects, a first portion (e.g., a half) of the bypass current flows from the common node to the positive node, and a second portion (e.g., another half) of the bypass current flows from the common node to the negative node. In some aspects, depending on the digital input code, only the at least one of the positive differential current switches and the at least one of the bypass switches are closed during digital-to-analog conversion, or only the at least one of the negative differential current switches and the at least one of the bypass switches are closed during the digital-to-analog conversion.

In some aspects, each segment may also include a third resistive element (e.g., resistive element 644 or 654) coupled between the positive nodes of adjacent segments of the resistor ladder circuit, and a fourth resistive element (e.g., resistive element 646 or 656) coupled between the negative nodes of the adjacent segments of the resistor ladder circuit. In some aspects, the resistance of at least one of the first resistive elements (e.g., resistive element 650) is twice the resistance of the third resistive element (e.g., resistive element 654), and the resistance of at least one of the second resistive elements (e.g., resistive element 652) is twice the resistance of the fourth resistive element (e.g., resistive element 656).

In certain aspects, selectively providing the bypass current may include selectively coupling a voltage rail (e.g., Vdd) to the at least one bypass switch via a current source (e.g., current source 630) of at least one of the plurality of current-steering cells. In some aspects, the bypass current may be a common-mode current. In some aspects, the digital-to-analog conversion may be performed by an R-2R resistor-ladder-based DAC. In some implementations, the DAC 400 may calibrate for mismatch associated with a transmitter DAC (e.g., DAC 308) via the analog output signal.

Certain examples above are described with respect to a calibration DAC (e.g., the DAC 390). Those of skill in the art will understand that aspects described herein may also be implemented in other types of DACs or DACs used for other purposes (e.g. the DAC 308).

Example Aspects

Aspect 1. A digital-to-analog converter (DAC) comprising: a plurality of current-steering cells, each having a bypass switch; and a resistor ladder circuit having multiple segments, each segment having a first resistive element and a second resistive element, the bypass switch being configured to selectively provide a bypass current to a common node between the first resistive element and the second resistive element.

Aspect 2. The DAC of aspect 1, wherein the first resistive element and the second resistive element are coupled between a positive node and a negative node of each of the multiple segments, each of the plurality of current-steering cells further comprising: a positive differential current switch configured to selectively provide a current to the positive node of the respective segment; and a negative differential current switch configured to selectively provide the current to the negative node of the respective segment.

Aspect 3. The DAC of aspect 2, wherein a first portion of the bypass current is configured to flow from the common node to the positive node, and wherein a second portion of the bypass current is configured to flow from the common node to the negative node.

Aspect 4. The DAC of aspect 3, wherein the first portion of the bypass current comprises a half of the bypass current, and wherein the second portion of the bypass current comprises another half of the bypass current.

Aspect 5. The DAC of any one of aspects 2-4, wherein, depending on a digital input code to the DAC: only the positive differential current switches and the bypass switches are configured to be closed during digital-to-analog conversion; or only the negative differential current switches and the bypass switches are configured to be closed during the digital-to-analog conversion.

Aspect 6. The DAC of any one of aspects 2-5, wherein each segment further comprises: a third resistive element coupled between the positive nodes of adjacent segments of the resistor ladder circuit; and a fourth resistive element coupled between the negative nodes of adjacent segments of the resistor ladder circuit.

Aspect 7. The DAC of aspect 6, wherein: a resistance of at least one of the first resistive elements is twice a resistance of the third resistive element; and a resistance of at least one of the second resistive elements is twice a resistance of the fourth resistive element.

Aspect 8. The DAC of any one of aspects 1-7, wherein each of the plurality of current-steering cells comprises a current source coupled between a voltage rail and the bypass switch.

Aspect 9. The DAC of any one of aspects 1-8, wherein the bypass current comprises a common-mode current.

Aspect 10. The DAC of any one of aspects 1-9, wherein the DAC is configured as an R-2R resistor-ladder-based DAC.

Aspect 11. The DAC of any one of aspects 1-10, wherein the DAC is configured to calibrate for mismatch associated with a transmitter DAC.

Aspect 12. A method for digital-to-analog conversion, comprising: receiving a digital input code; and generating an analog output signal based on the digital input code by selectively providing, via a bypass switch in each of at least one of a plurality of current-steering cells, a bypass current to a common node of at least one of multiple segments of a resistor ladder circuit, each of the multiple segments having a first resistive element and a second resistive element, the common node being between the first resistive element and the second resistive element of the at least one of the multiple segments.

Aspect 13. The method of aspect 12, wherein the first resistive element and the second resistive element are coupled between a positive node and a negative node of each of the multiple segments, each of the plurality of current-steering cells comprising a positive differential current switch and a negative differential current switch, wherein generating the analog output signal further comprises: selectively providing, via at least one of the positive differential current switches, a current to the positive node of at least one of the multiple segments; or selectively providing, via at least one of the negative differential current switches, the current to the negative node of at least one of the multiple segments.

Aspect 14. The method of aspect 13, wherein a first portion of the bypass current flows from the common node to the positive node, and wherein a second portion of the bypass current flows from the common node to the negative node.

Aspect 15. The method of aspect 14, wherein the first portion of the bypass current comprises a half of the bypass current, and wherein the second portion of the bypass current comprises another half of the bypass current.

Aspect 16. The method of any one of aspects 13-15, wherein, depending on the digital input code: only the at least one of the positive differential current switches and the at least one of the bypass switches in the plurality of current-steering cells are closed during the digital-to-analog conversion; or only the at least one of the negative differential current switches and the at least one of the bypass switches are closed during the digital-to-analog conversion.

Aspect 17. The method of any one of aspects 13-16, wherein each segment further comprises: a third resistive element coupled between the positive nodes of adjacent segments of the resistor ladder circuit; and a fourth resistive element coupled between the negative nodes of the adjacent segments of the resistor ladder circuit.

Aspect 18. The method of aspect 17, wherein: a resistance of at least one of the first resistive elements is twice a resistance of the third resistive element; and a resistance of at least one of the second resistive elements is twice a resistance of the fourth resistive element.

Aspect 19. The method of any one of aspects 12-18, wherein selectively providing the bypass current comprises selectively coupling a voltage rail to the bypass switch in the at least one of the plurality of current-steering cells via a current source of the at least one of the plurality of current-steering cells.

Aspect 20. The method of any one of aspects 12-19, wherein the bypass current comprises a common-mode current.

Aspect 21. The method of any one of aspects 12-20, wherein the digital-to-analog conversion is performed by an R-2R resistor-ladder-based digital-to-analog converter (DAC).

Aspect 22. The method of any one of aspects 12-21, further comprising calibrating for mismatch associated with a transmitter digital-to-analog converter (DAC) via the analog output signal.

Aspect 23. A digital-to-analog conversion system, comprising: a digital-to-analog converter (DAC) having a first output; and a calibration DAC having a second output coupled to the first output, wherein the calibration DAC comprises: a plurality of current-steering cells, at least one of the current-steering cells comprising a first switch, a second switch, and a third switch coupled in parallel; and a resistor ladder circuit having multiple segments, at least one of the segments having a first resistive element coupled between a first node and a common node, and a second resistive element coupled between the common node and a second node, wherein the first switch is coupled to the first node, the second switch is coupled to the second node, and the third switch is coupled to the common node.

Aspect 24. The digital-to-analog conversion system of aspect 23, wherein the at least one current-steering cell comprises a current source coupled between a voltage rail and a fourth node, wherein the first, second, and third switches are further coupled to the fourth node.

Aspect 25. The digital-to-analog conversion system of aspect 24, wherein the at least one segment further comprises: a third resistive element coupled between the first node and the second output; and a fourth resistive element coupled between the second node and the second output.

Aspect 26. The digital-to-analog conversion system of aspect 25, wherein: a resistance of the first resistive element is twice a resistance of the third resistive element; and a resistance of the second resistive element is twice a resistance of the fourth resistive element.

Aspect 27. The digital-to-analog conversion system of any one of aspects 23-26, wherein the first and second outputs are coupled to an input of a baseband filter.

Aspect 28. The digital-to-analog conversion system of aspect 27, wherein an output of the baseband filter is coupled to a mixer configured to upconvert a signal output from the baseband filter for wireless transmission.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A digital-to-analog converter (DAC) comprising:
a plurality of current-steering cells, each having a bypass switch; and
a resistor ladder circuit having multiple segments, each segment having a first resistive element and a second resistive element, the bypass switch being configured to selectively provide a bypass current to a common node between the first resistive element and the second resistive element.

2. The DAC of claim 1, wherein the first resistive element and the second resistive element are coupled between a positive node and a negative node of each of the multiple segments, each of the plurality of current-steering cells further comprising:
a positive differential current switch configured to selectively provide a current to the positive node of the respective segment; and
a negative differential current switch configured to selectively provide the current to the negative node of the respective segment.

3. The DAC of claim 2, wherein a first portion of the bypass current is configured to flow from the common node to the positive node, and wherein a second portion of the bypass current is configured to flow from the common node to the negative node.

4. The DAC of claim 3, wherein the first portion of the bypass current comprises a half of the bypass current, and wherein the second portion of the bypass current comprises another half of the bypass current.

5. The DAC of claim 2, wherein, depending on a digital input code to the DAC:
only the positive differential current switches and the bypass switches are configured to be closed during digital-to-analog conversion; or
only the negative differential current switches and the bypass switches are configured to be closed during the digital-to-analog conversion.

6. The DAC of claim 2, wherein each segment further comprises:
a third resistive element coupled between the positive nodes of adjacent segments of the resistor ladder circuit; and
a fourth resistive element coupled between the negative nodes of adjacent segments of the resistor ladder circuit.

7. The DAC of claim 6, wherein:
a resistance of at least one of the first resistive elements is twice a resistance of the third resistive element; and
a resistance of at least one of the second resistive elements is twice a resistance of the fourth resistive element.

8. The DAC of claim 1, wherein each of the plurality of current-steering cells comprises a current source coupled between a voltage rail and the bypass switch.

9. The DAC of claim 1, wherein the bypass current comprises a common-mode current.

10. The DAC of claim 1, wherein the DAC is configured as an R-2R resistor-ladder-based DAC.

11. The DAC of claim 1, wherein the DAC is configured to calibrate for mismatch associated with a transmitter DAC.

12. A method for digital-to-analog conversion, comprising:
receiving a digital input code; and
generating an analog output signal based on the digital input code by selectively providing, via a bypass switch in each of at least one of a plurality of current-steering cells, a bypass current to a common node of at least one of multiple segments of a resistor ladder circuit, each of the multiple segments having a first resistive element and a second resistive element, the common node being between the first resistive element and the second resistive element of the at least one of the multiple segments.

13. The method of claim 12, wherein the first resistive element and the second resistive element are coupled between a positive node and a negative node of each of the multiple segments, each of the plurality of current-steering cells comprising a positive differential current switch and a negative differential current switch, wherein generating the analog output signal further comprises:
selectively providing, via at least one of the positive differential current switches, a current to the positive node of at least one of the multiple segments; or
selectively providing, via at least one of the negative differential current switches, the current to the negative node of at least one of the multiple segments.

14. The method of claim 13, wherein a first portion of the bypass current flows from the common node to the positive node, and wherein a second portion of the bypass current flows from the common node to the negative node.

15. The method of claim 14, wherein the first portion of the bypass current comprises a half of the bypass current, and wherein the second portion of the bypass current comprises another half of the bypass current.

16. The method of claim 13, wherein, depending on the digital input code:
only the at least one of the positive differential current switches and the at least one of the bypass switches in the plurality of current-steering cells are closed during the digital-to-analog conversion; or
only the at least one of the negative differential current switches and the at least one of the bypass switches are closed during the digital-to-analog conversion.

17. The method of claim 13, wherein each segment further comprises:
a third resistive element coupled between the positive nodes of adjacent segments of the resistor ladder circuit; and
a fourth resistive element coupled between the negative nodes of the adjacent segments of the resistor ladder circuit.

18. The method of claim 17, wherein:
a resistance of at least one of the first resistive elements is twice a resistance of the third resistive element; and a resistance of at least one of the second resistive elements is twice a resistance of the fourth resistive element.

19. The method of claim 12, wherein selectively providing the bypass current comprises selectively coupling a voltage rail to the bypass switch in the at least one of the plurality of current-steering cells via a current source of the at least one of the plurality of current-steering cells.

20. The method of claim 12, wherein the bypass current comprises a common-mode current.

21. The method of claim 12, wherein the digital-to-analog conversion is performed by an R-2R resistor-ladder-based digital-to-analog converter (DAC).

22. The method of claim 12, further comprising calibrating for mismatch associated with a transmitter digital-to-analog converter (DAC) via the analog output signal.

23. A digital-to-analog conversion system, comprising:
a digital-to-analog converter (DAC) having a first output; and
a calibration DAC having a second output coupled to the first output, wherein the calibration DAC comprises:
a plurality of current-steering cells, at least one of the current-steering cells comprising a first switch, a second switch, and a third switch coupled in parallel; and
a resistor ladder circuit having multiple segments, at least one of the segments having a first resistive element coupled between a first node and a common node, and a second resistive element coupled between the common node and a second node, wherein the first switch is coupled to the first node, the second switch is coupled to the second node, and the third switch is coupled to the common node.

24. The digital-to-analog conversion system of claim 23, wherein the at least one current-steering cell comprises a current source coupled between a voltage rail and a fourth node, wherein the first, second, and third switches are further coupled to the fourth node.

25. The digital-to-analog conversion system of claim 24, wherein the at least one segment further comprises:
a third resistive element coupled between the first node and the second output; and
a fourth resistive element coupled between the second node and the second output.

26. The digital-to-analog conversion system of claim 25, wherein:
a resistance of the first resistive element is twice a resistance of the third resistive element; and
a resistance of the second resistive element is twice a resistance of the fourth resistive element.

27. The digital-to-analog conversion system of claim 23, wherein the first and second outputs are coupled to an input of a baseband filter.

28. The digital-to-analog conversion system of claim 27, wherein an output of the baseband filter is coupled to a mixer configured to upconvert a signal output from the baseband filter for wireless transmission.

* * * * *